(12) United States Patent
Breitwisch et al.

(10) Patent No.: US 8,447,714 B2
(45) Date of Patent: *May 21, 2013

(54) SYSTEM FOR ELECTRONIC LEARNING SYNAPSE WITH SPIKE-TIMING DEPENDENT PLASTICITY USING PHASE CHANGE MEMORY

(75) Inventors: Matthew Joseph Breitwisch, Essex Junction, VT (US); Roger W Cheek, Yorktown Heights, NY (US); Chung Hon Lam, Yorktown Heights, NY (US); Dharmendra Shantilal Modha, San Jose, CA (US); Bipin Rajendran, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 583 days.

This patent is subject to a terminal disclaimer.

(21) Appl. No.: 12/470,451

(22) Filed: May 21, 2009

(65) Prior Publication Data
US 2010/0299297 A1 Nov. 25, 2010

(51) Int. Cl.
*G06F 15/18* (2006.01)
*G06J 1/00* (2006.01)
*G06N 3/00* (2006.01)

(52) U.S. Cl.
USPC .......................................................... 706/33

(58) Field of Classification Search
USPC ......................................... 706/33, 15, 26, 62
See application file for complete search history.

(56) References Cited

U.S. PATENT DOCUMENTS

| | | | |
|---|---|---|---|
| 6,141,241 A | 10/2000 | Ovshinsky et al. | |
| 6,314,014 B1 | 11/2001 | Lowrey et al. | |
| 6,671,710 B2 | 12/2003 | Ovshinsky et al. | |
| 6,844,582 B2 | 1/2005 | Ueda et al. | |

(Continued)

FOREIGN PATENT DOCUMENTS

| | | |
|---|---|---|
| WO | 93/08575 A1 | 4/1993 |
| WO | 0062301 A1 | 10/2000 |

OTHER PUBLICATIONS

Linares-Barranco et al, "Memristance can explain Spike-Time-Dependent-Plasticity in Neural Synapses", Nature Precedings : hdl:10101/npre.2009.3010.1 : Posted Mar. 31, 2009.*

(Continued)

*Primary Examiner* — Jeffrey A Gaffin
*Assistant Examiner* — Ilya Traktovenko
(74) *Attorney, Agent, or Firm* — Kenneth L. Sherman, Esq.; Michael Zarrabian, Esq.; Sherman & Zarrabian LLP

(57) ABSTRACT

A system, method and computer program product for producing spike-dependent plasticity in an artificial synapse is disclosed. According to one embodiment, a method for producing spike-dependent plasticity in an artificial neuron comprises generating a pre-synaptic spiking event in a first neuron when a total integrated input to the first neuron exceeds a first predetermined threshold. A post-synaptic spiking event is generated in a second neuron when a total integrated input to the second neuron exceeds a second predetermined threshold. After the pre-synaptic spiking event, a first pulse is applied to a pre-synaptic node of a synapse having a phase change memory element. After the post-synaptic spiking event, a second varying pulse is applied to a post-synaptic node of the synapse, wherein current through the synapse is a function of the state of the second varying pulse at the time of the first pulse.

25 Claims, 11 Drawing Sheets

U.S. PATENT DOCUMENTS

| | | | |
|---|---|---|---|
| 6,999,953 | B2 | 2/2006 | Ovhsinsky |
| 7,085,155 | B2 | 8/2006 | Ovshinsky et al. |
| 7,092,923 | B2 | 8/2006 | Arima |
| 7,149,103 | B2 | 12/2006 | Ahn |
| 7,186,998 | B2 | 3/2007 | Ovshinsky et al. |
| 7,401,058 | B2 | 7/2008 | Michel et al. |
| 7,426,501 | B2 | 9/2008 | Nugent |
| 2004/0162796 | A1 | 8/2004 | Nugent |
| 2008/0191187 | A1* | 8/2008 | Lung et al. ............. 257/4 |
| 2009/0029031 | A1* | 1/2009 | Lowrey ............. 427/58 |
| 2009/0111212 | A1* | 4/2009 | Lowrey et al. ............. 438/102 |

OTHER PUBLICATIONS

Borghetti et al, "A hybrid nanomemristor/transistor logic circuit capable of self-programming", PNAS, Feb. 10, 2009, vol. 106, No. 6, p. 1699-1703.*

Nirschl et al, "Write Strategies for 2 and 4-bit Multi-Level Phase-Change Memory", Electron Devices Meeting, 2007.IEDM 2007. IEEE International, Dec. 10-12, 2007, p. 461-464, ISBN: 978-1-4244-1507-6, Current Version: Jan. 4, 2008.*

Breitwisch, "Phase Change Memory", This paper appears in: Interconnect Technology Conference, 2008. IITC 2008. International Issue Date: Jun. 1-4, 2008, on pp. 219-221, Date of Current Version: Jun. 20, 2008.*

Erokhin et al, "Polymeric Elements for Adaptive Networks", ISSN 1063-7745, Crystallography Reports, 2007, vol. 52, No. 1, pp. 159-166. Pleiades Publishing, Inc., 2007.*

Snider, "Spike-Timing-Dependent Learning in Memristive Nanodevices ", 2008 IEEE/ACM International Symposium on Nanoscale Architectures (NANOARCH 2008).*

Notification of Transmittal of the International Search Authority, International Search Report and Written Opinion dated Jul. 27, 2010 for International Application No. PCT/EP2010/054670 from the European Patent Office, filed Apr. 8, 2010, pp. 1-15, NL-2280 HV Rijswijk, Netherlands.

Nirschl, T. et al., "Write Strategies for 2 and 4-bit Multi-Level Phase-Change Memory," IEEE International Electron Devices Meeting (IEDM 2007), Dec. 10, 2007, IEEE, pp. 461-464, Piscataway, New Jersey, United States.

Linares-Barranco, B. et al., "Memristance Can Explain Spike-Time-Dependent-Plasticity in Neural Synapses," Nature Precedings, Mar. 31, 2009, downloaded Jul. 2, 2010, pp. 1-4, United States, <http://precedings.nature.com/documents/3010/version/1/files/npre20093010-1.pdf>.

Rajendran, B. et al., "Dynamic Resistance—A Metric for Variability Characterization of Phase-Change Memory," IEEE Electron Device Letters, Feb. 1, 2009, vol. 30, No. 2, pp. 126-129, IEEE Service Center, New York, New York, United States.

Lam, C. ed., "Phase-change Memory," 65th Annual Device Research Conference, Jun. 1, 2007, IEEE, pp. 223-226, United States.

Chen, K.N. et al., "Programmable via Using Indirectly Heated Phase-Change Switch for Reconfigurable Logic Applications," IEEE Electron Device Letters, vol. 29, No. 1, Jan. 1, 2008, pp. 131-133, IEEE Service Center, New York, New York, United States.

Snider, G.S. et al., "Spike-Timing-Dependent Learning in Memristive Nanodevices," 2008 IEEE/ACM International Symposium on Nanoscale Architectures (NANOARCH 2008), Jun. 12, 2008, IEEE, pp. 85-92, Piscataway, New Jersey, United States.

Pending Application, Title: Electronic Learning Synapse with Spike-Timing Dependent Plasticity Using Memory-Switching Elements.

Song et al., "Competetive Hebbian Learning Through Spike-Timing-Dependent Synaptic Plasticity", Nature Neuroscience, vol. 3, No. 9, Sep. 2000, p. 919.

Abbott et al., "Synaptic Depression and Cortical Gain Control", Science, vol. 275, Jan. 10, 1997, p. 220.

Snider, "Self-Organized Computation with Unreliable, Memristive Nanodevices", Nanotechnolody 18 (2007) 365202 (13pp).

Ananthanarayanan, "Anatomy of a Cortical Simulator", SC07 Nov. 10-16, 2007.

Abbott et al., "Synaptic Computation", Nature, vol. 431, Oct. 14, 2004, p. 796.

Rusu et al., "New Phase-Change Materials to Achieve Cognitive Computing—Overview and Future Trends", National Institute of R&D for Optoelectronics INOE 2000, Bucharest, Romania.

Ovshinshy, "The Ovonic Cognitive Computer—A New Paradigm", Keynot—Int. Symp. on Opeical Memory Nov. 4, 2003; Nara, Japan: to be published in JJAP Special Issue of Applied Physics, Jul. 2004.

Gupta, S. et al., "W-2W Current Steering DAC for Programming Phase Change Memory", Proceedings of the 2009 IEEE Workshop on Microelectronics and Electron Devices (WMED 2009), 4 pages, IEEE, United States.

Breitwisch, M.J., "Phase Change Memory", Proceedings of the 2008 International Interconnect Technology Conference (IITC 2008), Jun. 2008, pp. 219-221, IEEE, United States.

Notification of Transmittal of the International Search Authority, International Search Report and Written Opinion dated Jul. 27, 2010 for International Application No. PCT/EP2010/054719 from European Patent Office, filed Apr. 9, 2010, pp. 1-16, Rijswijk, The Netherlands.

U.S. Notice of Allowance for U.S. Appl. No. 12/470,403 mailed Apr. 13, 2012.

* cited by examiner

SYSTEM FOR ELECTRONIC LEARNING SYNAPSE WITH SPIKE-TIMING DEPENDENT PLASTICITY USING PHASE CHANGE MEMORY

BACKGROUND

1. Field of the Invention

The present invention relates to artificial neural networks. In specific, the present invention relates to electronic learning synapses with spike-dependent plasticity using phase change memory.

2. Background of the Invention

The point of contact between an axon of a neuron and a dendrite on another neuron is called a synapse, and with respect to the synapse, the two neurons are respectively called pre-synaptic and post-synaptic. The essence of our individual experiences is stored in conductance of the synapses. The synaptic conductance changes with time as a function of the relative spike times of pre-synaptic and post-synaptic neurons, as per spike-timing dependent plasticity (STDP). The STDP rule increases the conductance of a synapse if its post-synaptic neuron fires after its pre-synaptic neuron fires, and decreases the conductance of a synapse if the order of the two firings is reversed. Furthermore, the change depends on the precise delay between the two events, such that the more the delay, the less the magnitude of change.

Artificial neural networks are computational systems that permit computers to essentially function in a manner analogous to that of biological brains. Artificial neural networks do not generally utilize the traditional digital model of manipulating 0s and 1s. Instead, neural networks create connections between processing elements, which are roughly functionally equivalent to neurons of a biological brain. Artificial neural networks may be comprised of various electronic circuits that are modeled on biological neurons.

BRIEF SUMMARY

According to one embodiment of the present invention, a method for producing spike-dependent plasticity in an artificial neuron comprises: generating a pre-synaptic spiking event in a first neuron when a total integrated input to the first neuron exceeds a first predetermined threshold; generating a post-synaptic spiking event in a second neuron when a total integrated input to the second neuron exceeds a second predetermined threshold; after the pre-synaptic spiking event, applying a first pulse to a pre-synaptic node of a synapse having a phase change memory element; and after the post-synaptic spiking event, applying a second varying pulse to a post-synaptic node of the synapse, wherein current through the synapse is a function of the state of the second varying pulse at the time of the first pulse.

According to another embodiment of the present invention, a method for producing spike-dependent plasticity in an artificial neuron comprises: generating a pre-synaptic spiking event in a first neuron; generating a post-synaptic spiking event in a second neuron; after the pre-synaptic spiking event, applying a first pulse to a gate of a transistor, the transistor connected in series between a first end and a ground of a phase change memory element in a synapse; and after the post-synaptic spiking event, applying a second varying pulse to a post-synaptic node of the synapse, wherein current through the synapse is a function of the state of the second varying pulse at the time of the first pulse, and wherein conductance of the phase change memory element depends on the current through the synapse.

According to another embodiment of the present invention, an apparatus for producing spike-dependent plasticity in an artificial neuron comprises: a phase change memory device connected at a first ed to a post-synaptic terminal; a transistor in series between a first end and a ground of the phase change memory device, a gate of the transistor being connected to a pre-synaptic terminal; and a first neuron and a second neuron, wherein the first neuron and the second neuron generate a plurality of voltage pulses to the pre-synaptic and post-synaptic terminals respectively, the first neuron and the second neuron receiving inputs from a plurality of neurons and generating pre-synaptic and post-synaptic internal spiking events respectively when a total integrated input to each neuron exceeds predetermined first and second thresholds, wherein in response to the pre-synaptic spiking event, the first neuron generates a first pulse at the pre-synaptic terminal that occurs a predetermined period of time after the pre-synaptic spiking event, and wherein in response to the post-synaptic spiking event, the second neuron generates a second pulse at the post-synaptic terminal that comprises a plurality of pulses of increasing frequency, such that current through the phase change memory device is a function of the state of the second pulse at the time of the first pulse.

According to another embodiment of the present invention, an apparatus for producing spike-dependent plasticity in an artificial neuron comprises: a synapse having post-synaptic and pre-synaptic terminals, and a phase change memory device, the phase change memory device connected at a first end to the post-synaptic terminal; a transistor connected to a second end of the phase change memory device, a gate of the transistor being connected to the pre-synaptic terminal; a first neuron connected to the pre-synaptic terminal generating a first pulse in response to a pre-synaptic spiking event; and a second neuron connected to the post-synaptic terminal generating a second pulse in response to a post-synaptic spiking event, wherein the phase change memory conductance depends on which one of the pre-synaptic or post-synaptic spiking events occur first.

According to another embodiment of the invention, a computer program product for producing spike-dependent plasticity in an artificial neuron, the computer program product comprises: a computer usable medium having computer usable program code embodied therewith, the computer usable program code comprising: computer usable program code configured to: generate a pre-synaptic spiking event in a first neuron when a total integrated input to the first neuron exceeds a first predetermined threshold; generate a post-synaptic spiking event in a second neuron when a total integrated input to the second neuron exceeds a second predetermined threshold; after the pre-synaptic spiking event, apply a first pulse to a pre-synaptic node of a synapse having a phase change memory element; and after the post-synaptic spiking event, apply a second varying pulse to a post-synaptic node of the synapse, wherein current through the synapse is a function of the state of the second varying pulse at the time of the first pulse.

DETAILED DESCRIPTION

Figure 1:
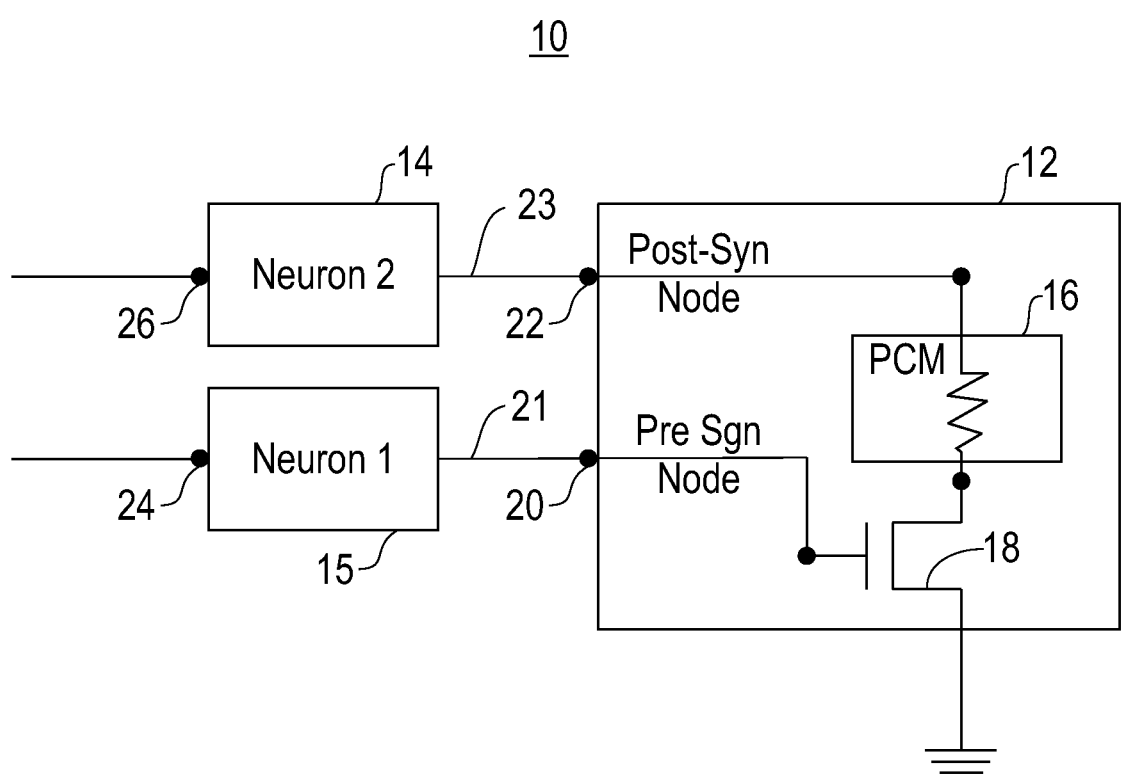
FIG. 1 shows a block diagram of an artificial synapse system in accordance with an embodiment of the invention.

Embodiments of the invention provide a system, method and computer readable medium for an electronic learning synapse with spike-timing dependent plasticity using phase change memory. The term "neuron" was coined by Heinrich Wilhelm Gottfried von Waldeyer-Hartz in 1891 to capture the discrete information processing units of the brain. The junctions between two neurons were termed "synapses" by Sir Charles Sherrington in 1897. Information flows only along one direction through a synapse, thus we talk about a "pre-synaptic" and a "post-synaptic" neuron. Neurons, when activated by sufficient input received via synapses, emit "spikes" that are delivered to those synapses that the neuron is pre-synaptic to. Neurons can be either "excitatory" or "inhibitory."

A brain can be thought of as a directed graph where nodes are neurons and edges are synapses. The following table shows the rough number of neurons and synapses in a mouse, rat, and human. Each neuron in mammalian cortex makes roughly 8,000 synapses with other neurons.

|  | Mouse | Rat | Human |
| --- | --- | --- | --- |
| Neurons | $16 \times 10^6$ | $56 \times 10^6$ | $22 \times 10^9$ |
| Synapses | $128 \times 10^9$ | $448 \times 10^9$ | $220 \times 10^{12}$ |

The computation, communication, and memory resources of the brain all scale with the number of synapses and not with the number of neurons. Even power and space requirements scale with the number of synapses.

Some of the physical characteristics of the synapses are as follows. Synaptic density is roughly $7.2 \times 10^8$ per $mm^3$ which roughly corresponds to placing synapses at three dimensional grids with 1 μm spacing in every direction. This figure seems to be a constant of nature across all mammalian cortices.

Synaptic weight is the influence that a pre-synaptic firing will have on post-synaptic neuron. Synaptic weights are plastic or adaptive, and change through time. Synaptic weight exhibits two forms of plasticity: (a) Long-term and (b) Short-term. Long-term changes in the transmission properties of synapses provide a physiological substrate for learning and memory, whereas short-term changes support a variety of computations. The mechanism of short-term plasticity is a form of gain control, and is not treated in this disclosure.

The mechanism of long-term weight adaptation is known as spike-timing dependent plasticity (STDP). Causality is a key element of STDP. Correlated activity can occur purely by chance, rather than reflecting a causal relationship that should be learned. Inputs that consistently are best at predicting a post-synaptic response should become the strongest inputs to the neuron. Thus in STDP, synapses are only strengthened if their pre-synaptic action potential precede, and thus could have contributed to, the firing of the post synaptic neuron. Accidental, non-causal coincidences will weaken synapses.

We describe one of the prevalent phenomenological description of STDP: (a) if pre-synaptic neuron fires t milliseconds before the post-synaptic neuron fires then the synaptic weight is increased (strengthened, potentiated) by $A_+ \exp(-t/\tau)$ where $A_+$ and $\tau$ are constants; (b) if pre-synaptic neuron fires t milliseconds after the post-synaptic neuron fires then the synaptic weight is decreased (weakened, depressed) by $A_- \exp(-t/\lambda)$ where $A_-$ and $\lambda$ are constants.

If the synapse is assumed to be binary, then, at the broadest level, STDP can be summarized as follows: if the post-synaptic neuron fires within a short time of the pre-synaptic neuron, then synapse is turned fully ON, whereas if the pre-synaptic neuron fires within a short time of the post-synaptic neuron, then synapse is turned fully OFF. The STDP rule permits the brain to extract causality and correlations from a spatio-temporally varying environment.

A key characteristic of classical von Neumann computing is the separation of computation and memory. Specifically, if a memory location is to be modified, it is brought into a separate computing unit, modified, and then restored. This three-step process creates the classical von Neumann bottleneck that has plagued modern computer systems.

In contrast to von Neumann computing, synapses are memory elements that are modified in-place, that is, memory and computation are distributed in the brain. Embodiments of the present invention disclose a synapse-like device, which breaks the mold of traditional computing by creating a form of active memory. In general, embodiments of the present invention include a two-terminal device that exhibits synapse-like function, akin to STDP.

The present invention makes use of a unipolar memory-switching element whose program and erase operations can be accomplished with the same voltage polarity. An example of such a device is a phase-change memory (PCM). A phase-change memory device can be switched as follows: a lower voltage (current) pulse to program or set (that is, go from low conductance amorphous state to high conductance crystalline state) and a higher voltage (current) pulse to erase or reset (that is, go from high conductance to low conductance state). Embodiments of the invention make use of novel bipolar pre and post-synaptic pulses that can capture the essence of STDP in such materials. Specifically, by using the PCM device controlled by a MOS transistor, these novel pre and post-synaptic pulses can be shaped to program the device if post-synaptic pulse follows the pre-synaptic pulse within 100 ms, or erase the device if pre-synaptic pulse follows the post-synaptic pulse within 100 ms. The disclosed embodiments may also permit multiple conductance states, and can reward causality and punish anti-causality in a STDP-like way. In particular, embodiments of the invention match physical switching characteristics of the phase-change material to a workable approximation of the required STDP curve via a design of pulses that are applied to electrodes representing post-synaptic and pre-synaptic neurons.

FIG. 1 shows a schematic of the artificial synapse system 10 which consists of an artificial binary synapse 12, a first neuron 15 and a second neuron 14. The artificial binary synapse 12 includes a two terminal PCM device 16 connected in series with a MOS transistor 18. That is, one side of the MOS transistor 18 is connected to a first terminal of the PCM device 16, and the other side of the MOS transistor 18 is connected to ground. The artificial binary synapse 12 includes a pre-synaptic node 20 and a post-synaptic node 22. The first neuron 15 is connected to pre-synaptic node 20 through axon 21. The second neuron 14 is connected to the post-synaptic node 22 through dendrite 23. The gate of the MOS transistor 18 is connected to the pre-synaptic node 20. A second terminal of the PCM device 16 is connected to the post-synaptic node 22. The first neuron 15 has a dendrite, 24 and the second neuron 14 has an axon 26. The first and second neurons are part of a network of neurons that connect to each other through synapses. These neurons may be processing elements that transmit information as electrical signals that propagate from the neuron cell body through the axon, past the synapse and through the dendrite. In this sense, the axon can be considered as the output terminal of the neuron, and the dendrite can be considered its input terminal.

The PCM device 16 is assumed to have a threshold voltage, $V_{Th}$=0.9V. If the PCM device 16 is in the low conductance amorphous (RESET) state, voltages less than $V_{Th}$ applied across it will not cause current to flow, but voltages greater than $V_{Th}$ will result in threshold switching behavior, and current will flow through the device. Various PCM devices may be used in the embodiments of the invention. For example, these embodiments may use PCM cells fabricated in the mushroom cell configuration or the pore cell configuration; both configurations being known to those skilled in the art.

It is assumed that the application of 1.5V to the gate of the transistor, (the pre-synaptic node 20) fully turns it ON, and the current through the PCM device 16 is then primarily determined by the magnitude of the voltage applied to the post-synaptic node 22. In other words, when the transistor turns ON, the PCM device 16 becomes ready to conduct. However, whether the device conducts or not depends upon the precise voltage applied during this window at the post-synaptic node 22.

To create an electronic synapse, the present invention addresses how the conductance of the PCM device 16 changes as a function of the relative timing between the onset of pre-synaptic and post-synaptic pulses. As discussed below, in accordance with embodiments of the invention, the resistance of the PCM device 16 can be manipulated by application of specific electric pulses.

Figure 2:
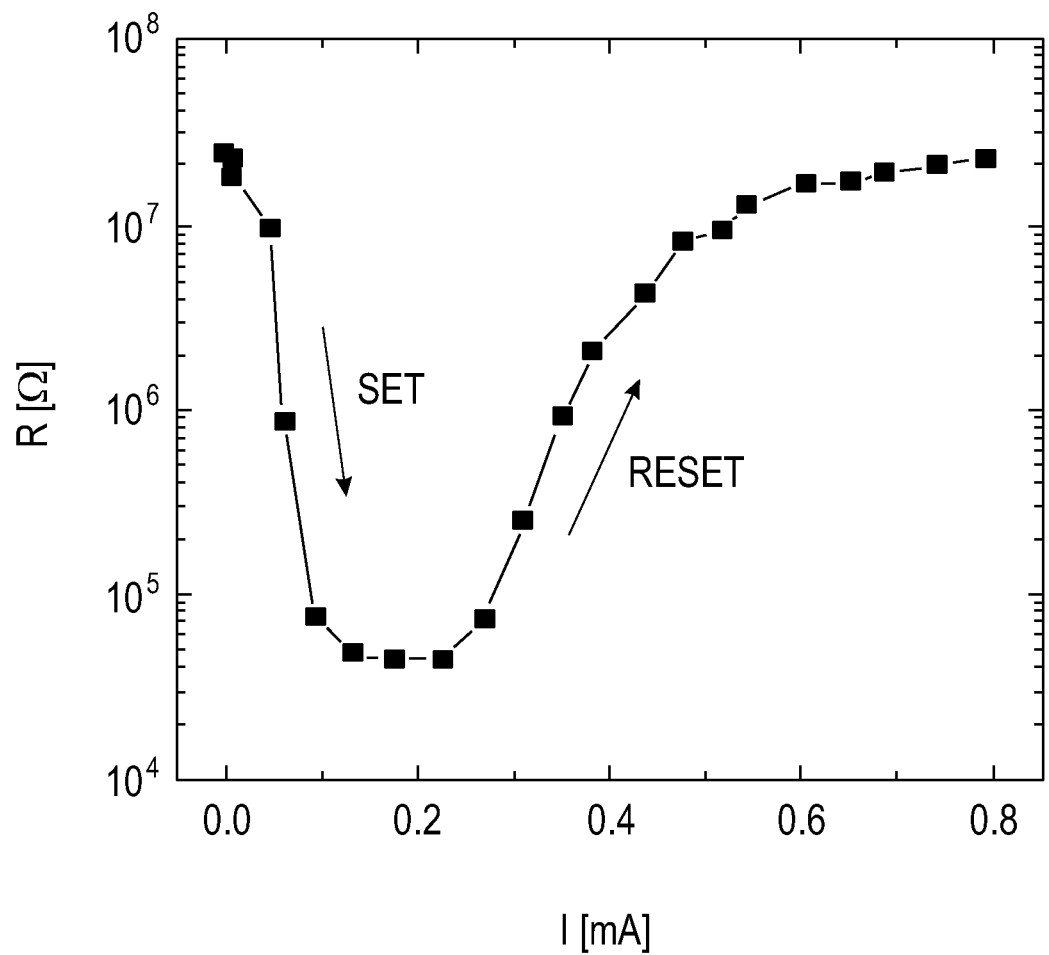
FIG. 2 shows exemplary resistance characteristics of a phase change memory device as a function of current through the device.

FIG. 2 shows a graph illustrating how the resistance of a PCM device may be increased starting from a low resistance state. By applying a current pulse to the device, with a magnitude in the range of 0.25 mA to 0.6 mA, lasting about 20-50 ns, and with a fall time less than 5 ns, the resistance of the PCM device can be increased from about 20 KΩ to about 20 MΩ. In the branch of the curve marked RESET, applying current pulses of increasing amplitude (shown in the X-axis) leads to higher resistance for the PCM cell.

Figure 3:
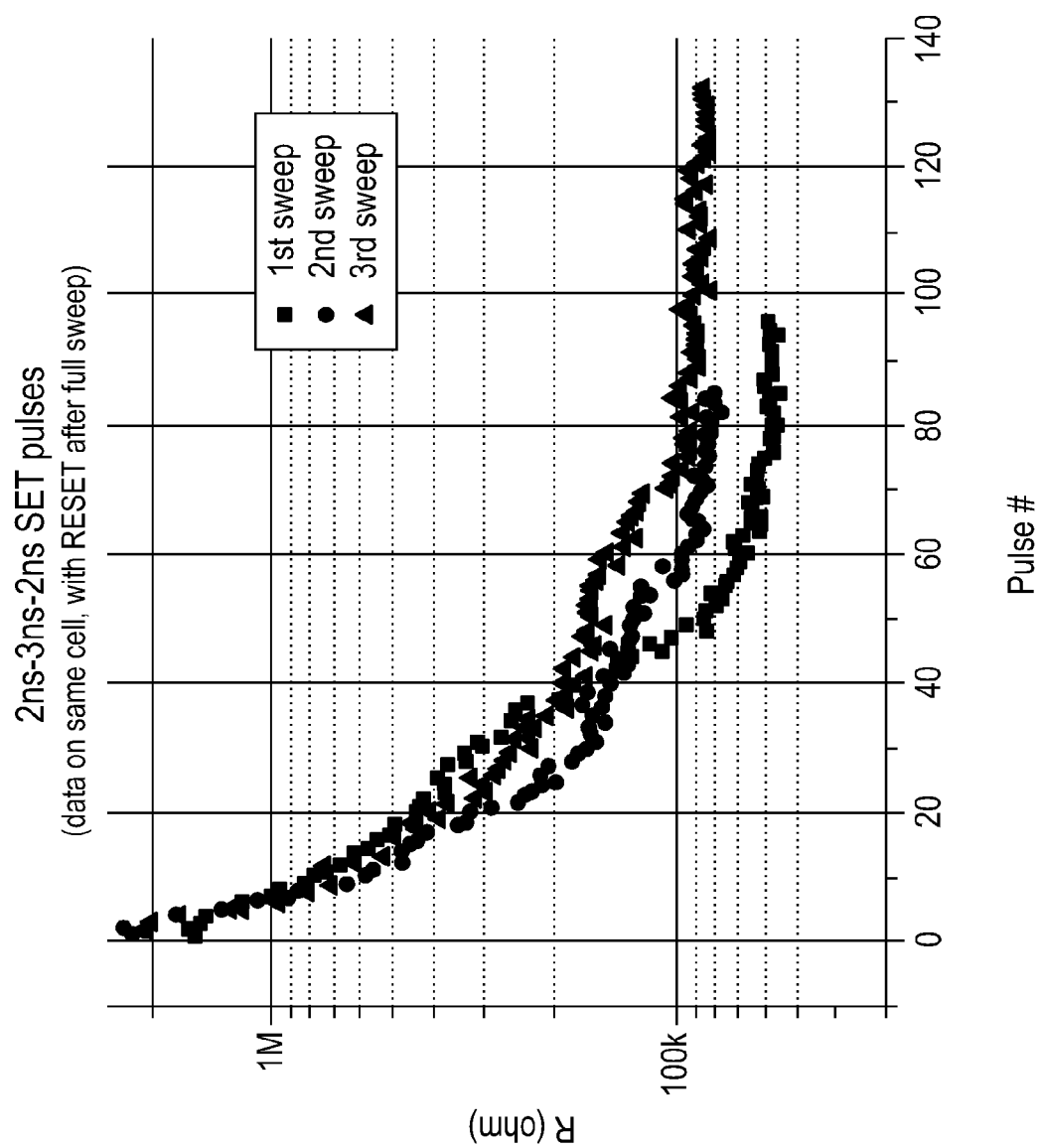
FIG. 3 shows exemplary resistance characteristics of a phase change memory device as a function of SET pulses applied to the device.

FIG. 3 shows a graph illustrating how to decrease the resistance of a PCM device starting from a high resistance state. By applying a sequence of current pulses to the device, with a constant magnitude in the range of 0.1 mA to 0.2_mA, lasting about 2-5 ns, the resistance of the PCM device can be decreased steadily from about 20 KΩ to about 20 MΩ.

In accordance with embodiments of the invention, the previously described characteristics of the PCM material can be utilized for the purpose of eliciting a synapse-like behavior by careful design of pulses that are applied to the pre-synaptic node 20 and post-synaptic nodes 22 shown in FIG. 1.

Figure 4:
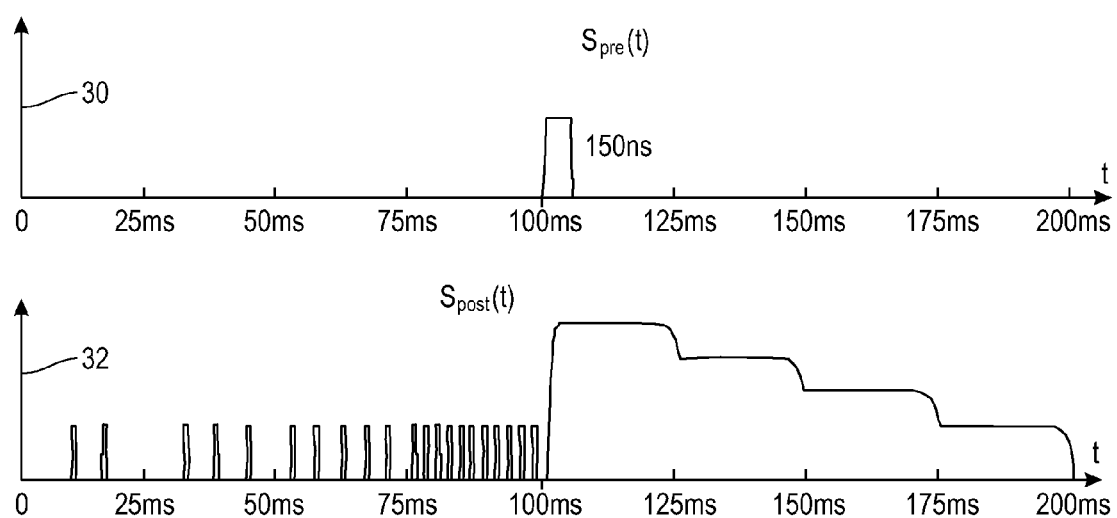
FIG. 4 shows exemplary transformed pre-synaptic and post-synaptic pulses generated by the pulse shaper 14 shown in FIG. 1 in accordance with an embodiment of the invention.

FIG. 4 shows the pre-synaptic and post-synaptic pulses generated by the first and second neurons 15, 14 in accordance with an embodiment of the invention. The neurons may comprise processing elements that include internal integrate and fire circuits, which are well known in the art. The purpose of these internal integrate and fire circuits is to continuously integrate the total input electrical quantity (which could be current, or charge) and to generate specific pulses that are applied at the axon 21 and dendrite 23 when that integrated input exceeds a predetermined threshold value. The exact value of the predetermined threshold may be determined based on various factors, such as the value of the current supplied by each input, the number of inputs, the desired performance of the neuron, and other factors.

The applied pre-synaptic pulse (labeled "$S_{pre}(t)$") may be a 1.5V spike of very narrow width (100-150 nsec), which is triggered 100 ms after the output of the internal integrate and fire circuit of the neuron exceeds a predetermined threshold value. The original spiking event of the first neuron 15 occurs at time t=0 in the graph in FIG. 4. The applied post-synaptic pulse is the waveform (labeled "$S_{post}(t)$") and may be applied shortly after the output of the internal integrate and fire circuit of the second neuron 14 exceeds a predetermined threshold value. The original spiking event of the second neuron 14 also occurs at time t=0 in the graph in FIG. 4. The applied post synaptic pulse, may comprise a series of short pulses, each lasting 5 ns, arriving at a rate of about 40 MHz in the first 25 ns, 50 MHz between 25 to 50 ms, 66 MHz between 50 to 75 ms and 100 MHz pulses between 75 to 100 ms. After 100 ms, this pulse is a set of stair-case voltages, each stair lasting for 25 ms, and going down from 2V to 0.5V.

When there are no pre-synaptic and post-synaptic spikes, 0V is applied to both the pre-synaptic node 20 and the post-synaptic node 22 of the artificial synapse 12 shown in FIG. 1.

The main purpose of the transistor 18 is to restrict the current that could potentially flow through the synapse to just the time when the pre-synaptic signal is high. Thus, the energy dissipated per synaptic operation is greatly reduced, since current flows for 100-150 ns instead of ~200 ms.

Figure 5:
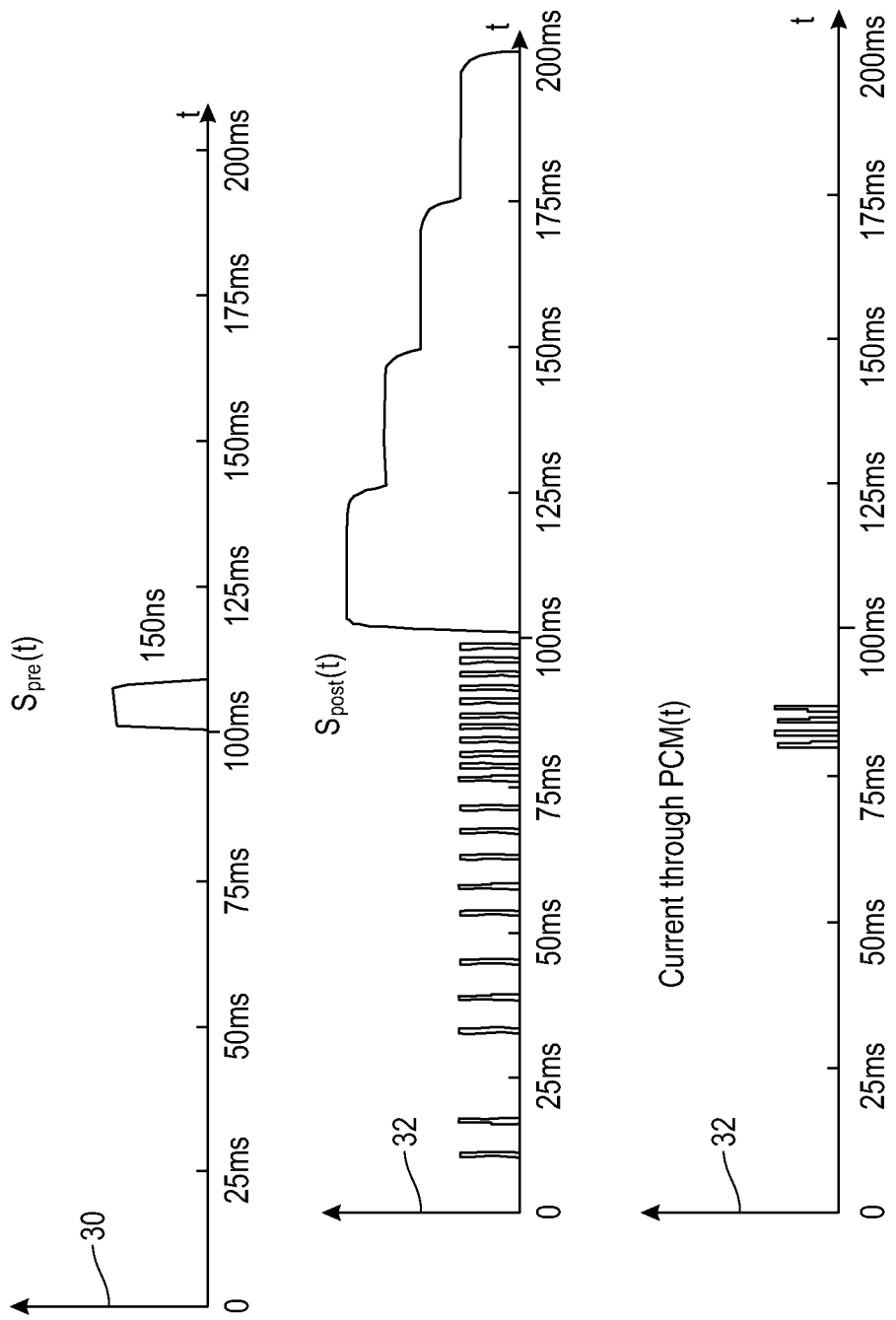
FIG. 5 shows applied pre-synaptic and post-synaptic pulses when the original pre-synaptic spike arrives just before the original post-synaptic spike, within a desired time window in accordance with an embodiment of the invention.
Figure 6:
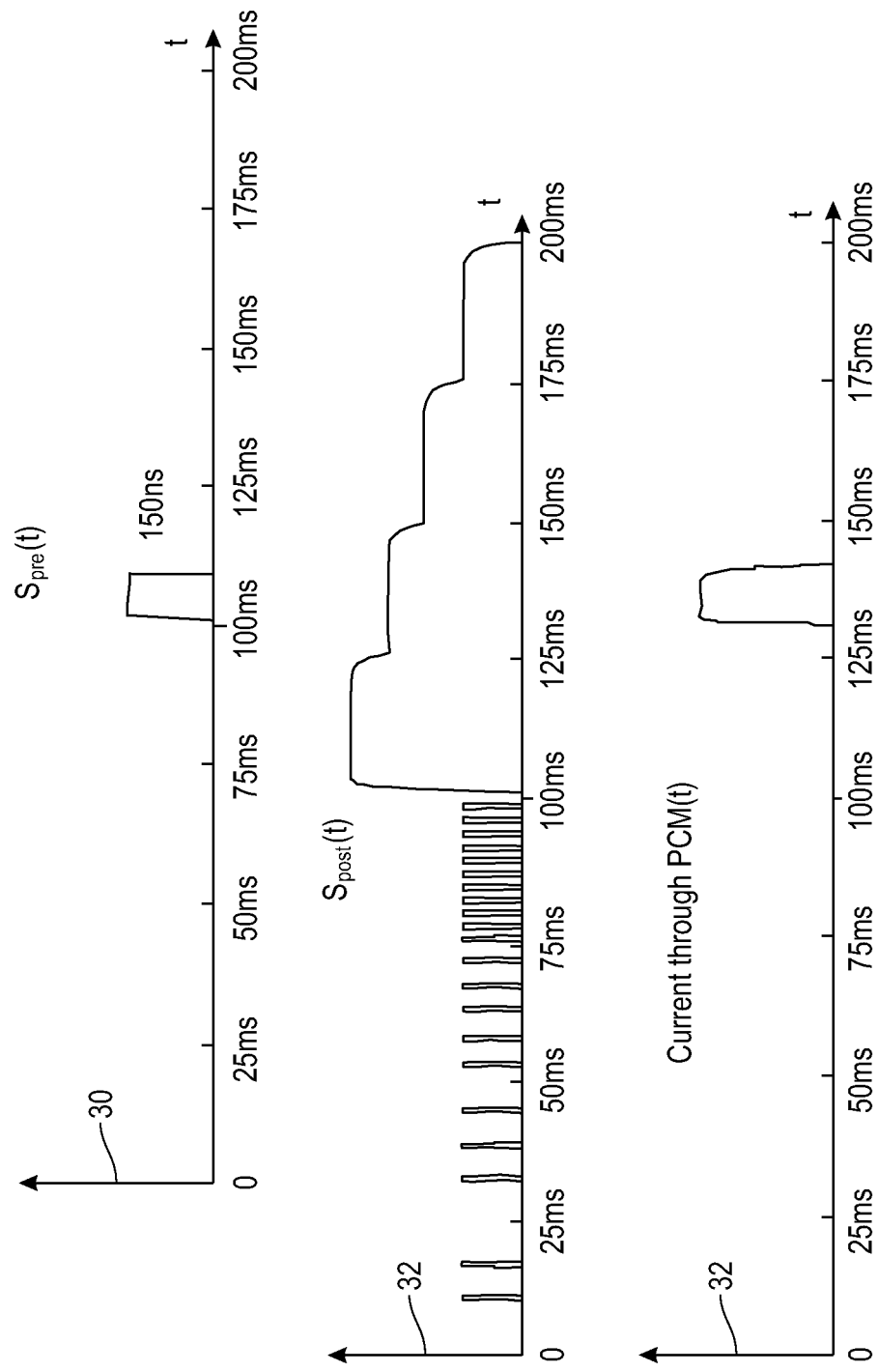
FIG. 6 shows applied pre-synaptic and post-synaptic pulses when the original pre-synaptic spike arrives just after the original post-synaptic spike, within a desired time window, in accordance with an embodiment of the invention.
Figure 7:
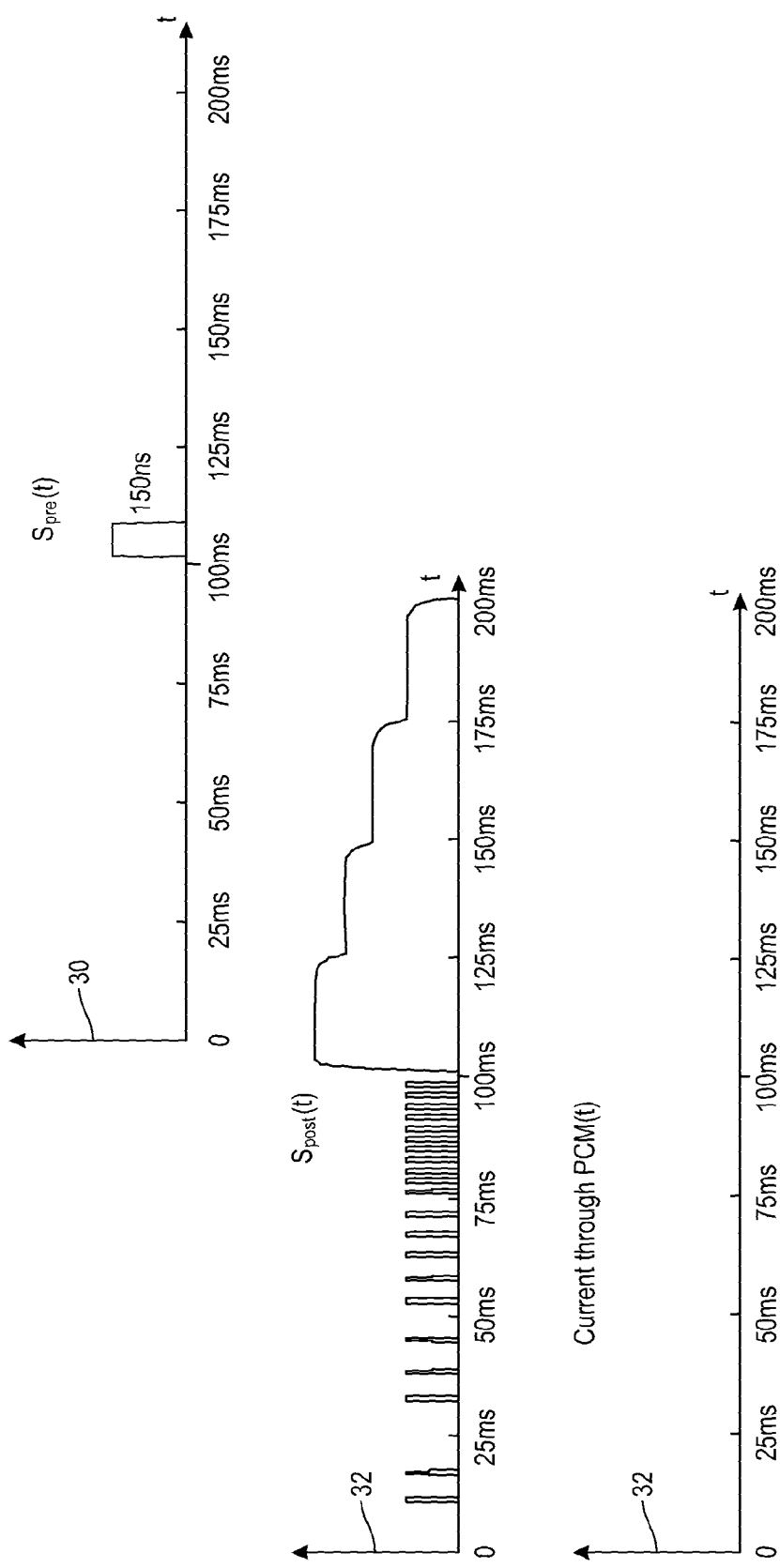
FIG. 7 shows applied pre-synaptic and post-synaptic pulses when the original pre-synaptic spike arrives much before or after the original post-synaptic spike in accordance with an embodiment of the invention.

To further illustrate the various embodiments of the invention, FIGS. 5-7 show the applied pre-and post-synaptic pulses in three different cases. In the first case, the original pre-synaptic neuron firing event 30 occurs just before the original post-synaptic neuron firing event 32. In this embodiment, the time difference between the two events is about 20 ms. With this time difference, the overlap between the two pulses happens such that the resultant current through the PCM device 16 is a series of short pulses, lasting about 2 ns, which causes it to go to (or remain in) the SET state. It should be noted that the actual number of pulses that are applied may depend on the time difference between the original pre and post synaptic spikes. Larger number of pulses may be applied if there is a relatively small time delay between the spikes. The number of applied pulses may be decreased as this time delay increases. Since the PCM cell 16 resistance continuously decreases as a function of the number of pulses applied to it, the PCM cell 16 conductance is increased strongly for small time delays, and increased weakly as the time delay itself increases.

FIG. 6 illustrates a second case, where the original pre-synaptic neuron firing event occurs just after the original post-synaptic neuron firing event, which is within 30 ms in this example. The result is that the current through the PCM cell 16 is a pulse of constant amplitude, where the amplitude is determined by the time delay between the arrivals of the original spikes. The large magnitude of current flowing through the PCM cell 16 causes it to go to (or remain in) the RESET state. For a relatively small time delay, there will be a large magnitude of current flowing through the cell, strongly RESETing the cell, or strongly decreasing the cell conductance. As the time delay between the pulses increases, the magnitude of current that flows through the cell also decreases, thereby decreasing the effectiveness of the RESET pulse.

FIG. 7 shows a third case, where the original pre-synaptic spiking event occurs much before or after the original post-synaptic spiking event, that is, outside of a desired maximum time window, which may be 105 ms in this embodiment. This results in a 0V pulse across the PCM cell 16, because the transistor 18 is never turned on so the state of the PCM cell 16 does not change.

It is noted that the precise values of actual voltages are for illustration only and may vary with particular applications. It is the predetermined pulse shapes and timing control that are used by embodiments to achieve the advantages of the invention.

Figure 8:
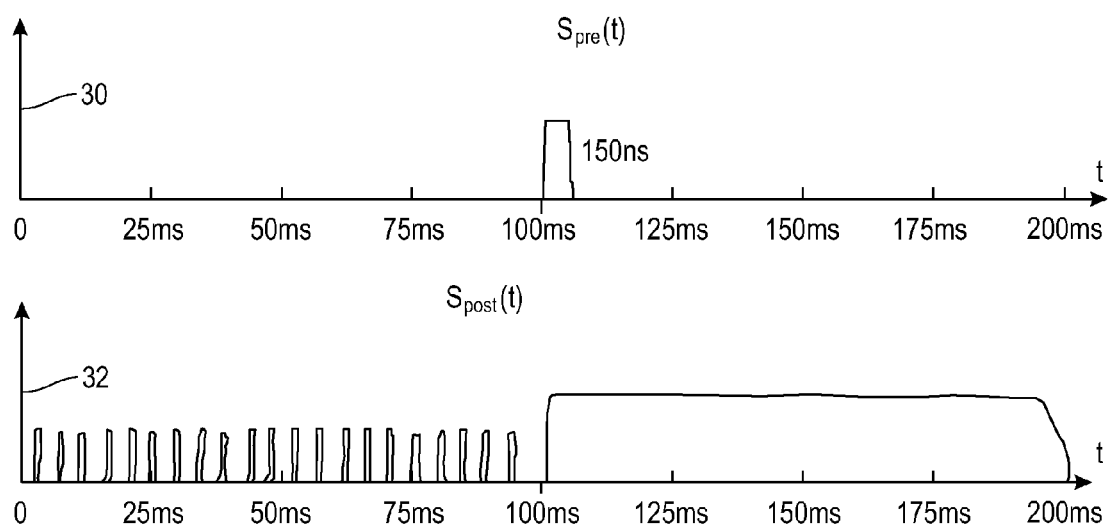
FIG. 8 shows exemplary transformed pre-synaptic and post-synaptic pulses generated by the pulse shaper for a binary synapse in accordance with an embodiment of the invention.

The above-discussed embodiments show how to create an artificial electronic synapse with multiple conductance states. However, if only a simpler binary synapse is desired then it can be achieved as follows. Specifically, in an additional embodiment of the invention, shown in FIG. 8, the same pre-synaptic pulse shown in FIG. 4 may be used. However, the post-synaptic pulse as shown in FIG. 8 may be simplified such that from 0 to 100 ms—a pulse train with uniform frequency is used—and from 100 to 200 ms a pulse with constant voltage level is used. This results in a binary synapse, with a single current level through the PCM 16, instead of the plurality of current levels that depend on the relative timing of the original incoming spikes, as shown in the example in FIG. 6.

Figure 9:
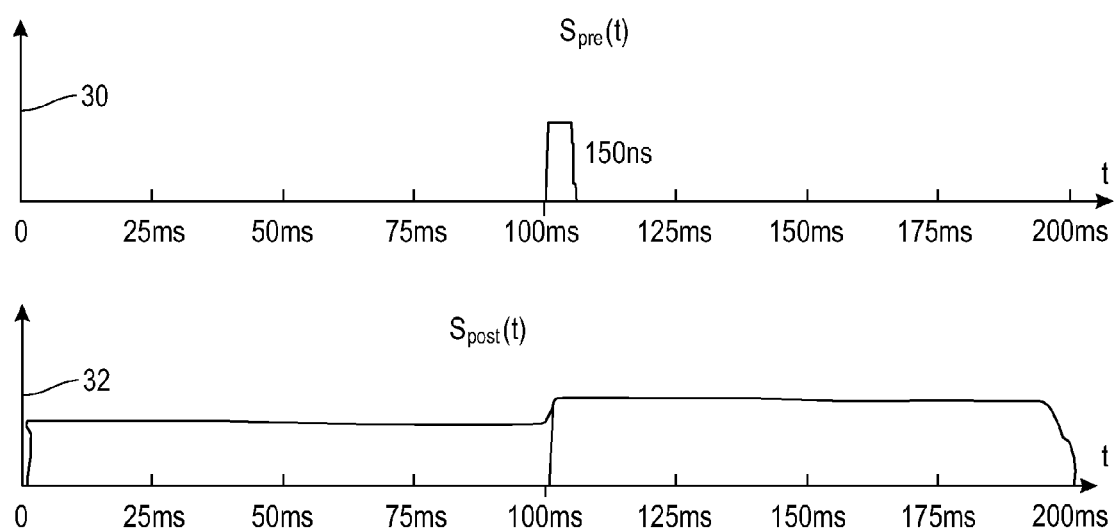
FIG. 9 shows exemplary transformed pre-synaptic and post-synaptic pulses generated by the pulse shaper for a binary synapse in accordance with an embodiment of the invention.

FIG. 9 shows another alternative embodiment of the invention, which is the same as FIG. 8 except that from 0-100 ms the series of voltage pulses in the post-synaptic pulse are replaced by a constant voltage followed by an increased voltage level that returns to zero at 200 ms. The magnitudes of the voltage levels for these two intervals are chosen such that if the overlap between the two signals happens between 0-100 ms, the resistance of the cell decreases, while an overlap between 100-200 ms leads to an increase in the resistance.

Anti-STDP has been widely observed, and is essentially the reverse of STDP. By simply flipping the post-synaptic pulse in FIG. 4 around the y-axis at 100 ms—the resulting pulse can be used to elicit anti-STDP behavior.

Figure 10:
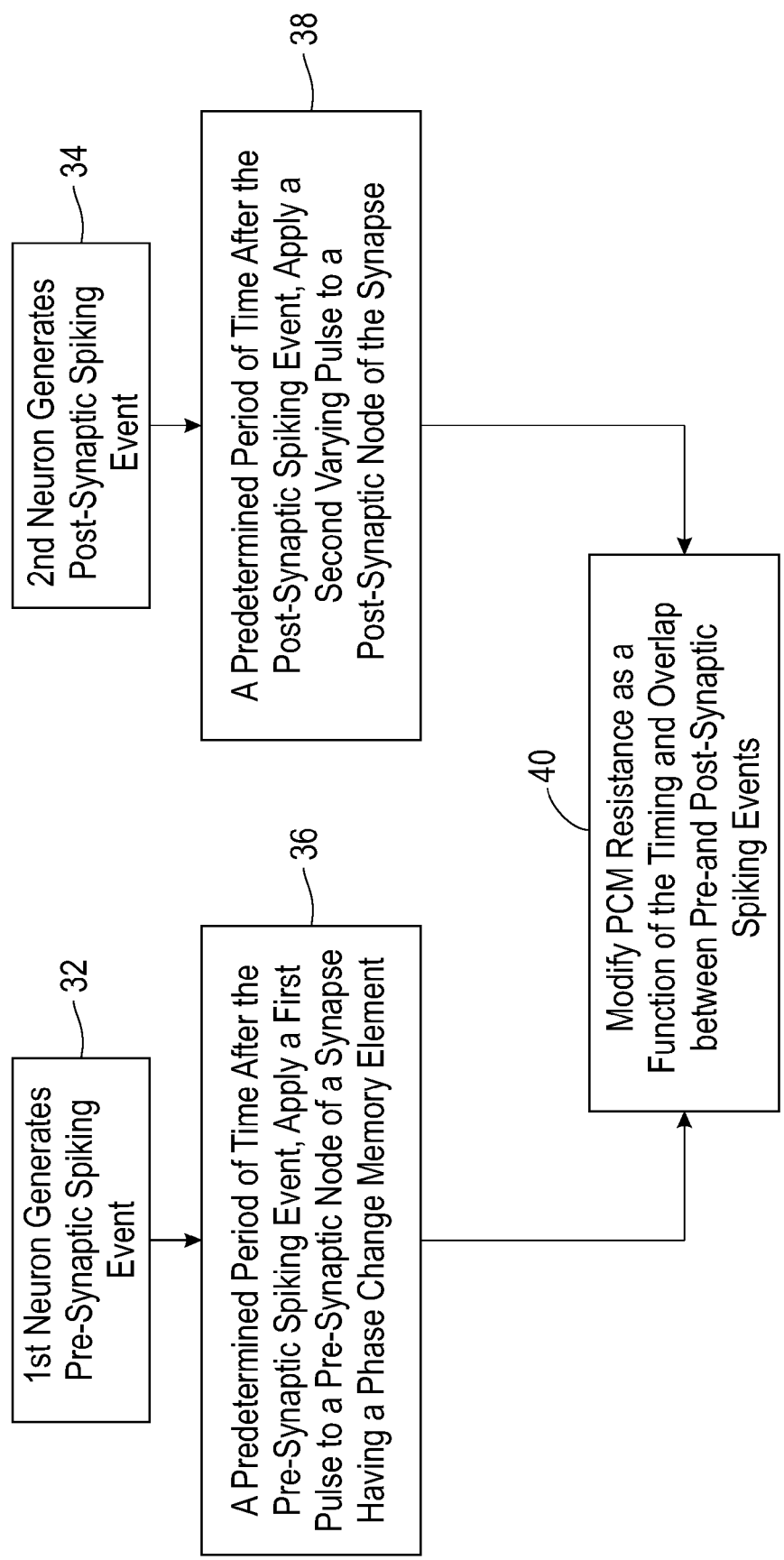
FIG. 10 shows a flowchart of a process for producing spike-timing dependent plasticity in an artificial synapse in accordance with an embodiment of the invention.

FIG. 10 shows a flowchart of a process 30 for causing an electronic learning synapse to exhibit spike-timing dependent plasticity using phase-change memory switching elements in accordance with an embodiment of the invention. At block 32, first neuron 15 generates a pre-synaptic spiking event. At block 34 a second neuron 14 generates a post-synaptic spiking event. As described above, the order and relative timing of the pre-and post-synaptic spiking events may vary. A first period of time after the pre-synaptic spiking event, a first pulse is applied to a pre-synaptic node (such as node 20) of a synapse (such as synapse 12), having a phase change memory element, at block 36. The phase change memory element may comprise phase change memory 16. A second period of time after the post-synaptic spiking event, a second varying pulse may be applied to a post-synaptic node, such as node 22, of the synapse, wherein the current through the synapse is a function of the state of the second varying pulse at the time of the first pulse. The shape of the first and second pulses may be, for example, as shown in FIG. 4, in one embodiment, or, as in FIGS. 8 and 9 in other embodiments. In block 40, the resistance of the PCM is modified as a function of the relative timing of the pre-and post-synaptic spiking events.

As can be seen from the above disclosure, embodiments of the invention provide an electronic learning synapse with spike-timing dependent plasticity using phase change memory-switching elements. As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

Furthermore, the present invention may take the form of a computer program product embodied in any tangible medium of expression having computer usable program code embodied in the medium. Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, for instance, via optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wire line, optical fiber cable, and RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 11:
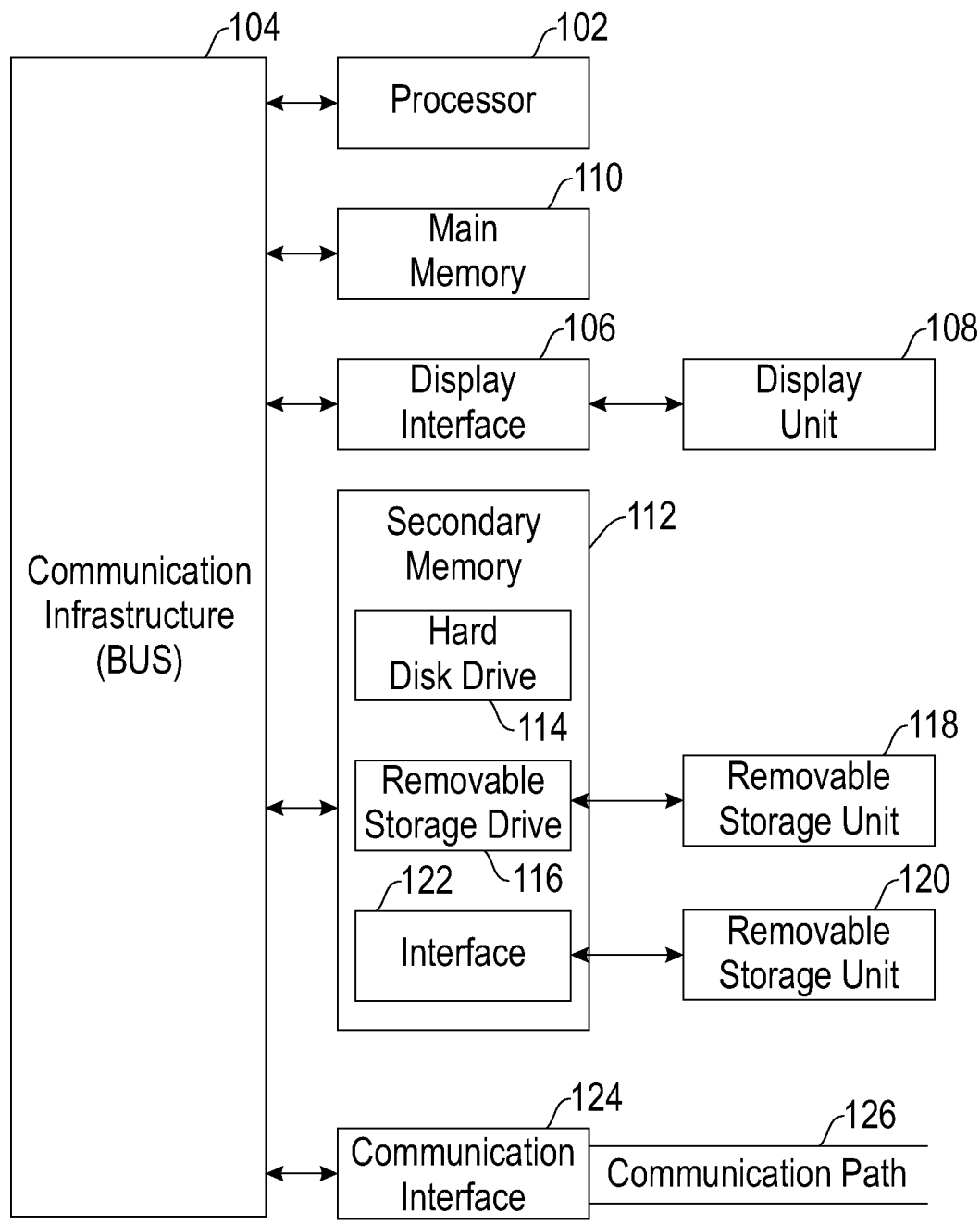
FIG. 11 shows a high level block diagram of an information processing system useful for implementing one embodiment of the present invention.

FIG. 11 is a high level block diagram showing an information processing system useful for implementing one embodiment of the present invention. The computer system includes one or more processors, such as processor 102. The processor 102 is connected to a communication infrastructure 104 (e.g., a communications bus, cross-over bar, or network). Various software embodiments are described in terms of this exemplary computer system. After reading this description, it will become apparent to a person of ordinary skill in the relevant art(s) how to implement the invention using other computer systems and/or computer architectures.

The computer system can include a display interface 106 that forwards graphics, text, and other data from the communication infrastructure 104 (or from a frame buffer not shown) for display on a display unit 108. The computer system also includes a main memory 110, preferably random access memory (RAM), and may also include a secondary memory 112. The secondary memory 112 may include, for example, a hard disk drive 114 and/or a removable storage drive 116, representing, for example, a floppy disk drive, a magnetic tape drive, or an optical disk drive. The removable storage drive 116 reads from and/or writes to a removable storage unit 118 in a manner well known to those having ordinary skill in the art. Removable storage unit 118 represents, for example, a floppy disk, a compact disc, a magnetic tape, or an optical disk, etc. which is read by and written to by removable storage drive 116. As will be appreciated, the removable storage unit 118 includes a computer readable medium having stored therein computer software and/or data.

In alternative embodiments, the secondary memory 112 may include other similar means for allowing computer programs or other instructions to be loaded into the computer system. Such means may include a removable storage unit 120 and an interface 122. Other examples of such means may include a program cartridge and cartridge interface (such as that found in video game devices), a removable memory chip (such as an EPROM, or PROM) and associated socket, and other removable storage units 120 and interfaces 122 which allow software and data to be transferred from the removable storage unit 120 to the computer system.

The computer system may also include a communications interface 124. Communications interface 124 allows software and data to be transferred between the computer system and external devices. Examples of communications interface 124 may include a modem, a network interface (such as an Ethernet card), a communications port, or a PCMCIA slot and card, etc. Software and data transferred via communications interface 124 are in the form of signals which may be, for example, electronic, electromagnetic, optical, or other signals capable of being received by communications interface 124. These signals are provided to communications interface 124 via a communications path (i.e., channel) 126. This communications path 126 carries signals and may be implemented using wire or cable, fiber optics, a phone line, a cellular phone link, an RF link, and/or other communications channels.

In this document, the terms "computer program medium," "computer usable medium," and "computer readable medium" are used to generally refer to media such as main memory 110 and secondary memory 112, removable storage drive 116, and a hard disk installed in hard disk drive 114.

Computer programs (also called computer control logic) are stored in main memory 110 and/or secondary memory 112. Computer programs may also be received via communications interface 124. Such computer programs, when executed, enable the computer system to perform the features of the present invention as discussed herein. In particular, the computer programs, when executed, enable the processor 102 to perform the features of the computer system. Accordingly, such computer programs represent controllers of the computer system.

From the above description, it can be seen that the present invention provides a system, computer program product, and method for implementing the embodiments of the invention. References in the claims to an element in the singular is not intended to mean "one and only" unless explicitly so stated, but rather "one or more." All structural and functional equivalents to the elements of the above-described exemplary embodiment that are currently known or later come to be known to those of ordinary skill in the art are intended to be encompassed by the present claims. No claim element herein is to be construed under the provisions of 35 U.S.C. section 112, sixth paragraph, unless the element is expressly recited using the phrase "means for" or "step for."

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for producing spike-dependent plasticity in an artificial synapse comprising:
   generating a pre-synaptic spiking event in a first neuron when a total integrated input to said first neuron exceeds a first predetermined threshold;
   wherein the first neuron comprises an integrate and fire circuit for integrating inputs received by the neuron;
   generating a post-synaptic spiking event in a second neuron when a total integrated input to said second neuron exceeds a second predetermined threshold;
   wherein the second neuron comprises an integrate and fire circuit for integrating inputs received by the neuron;
   after said pre-synaptic spiking event, applying a first pulse to a pre-synaptic node of a synapse having a phase change memory element; and
   after said post-synaptic spiking event, applying a second varying pulse to a postsynaptic node of said synapse;
   wherein current through said synapse is a function of the state of said second varying pulse at the time of said first pulse and relative timing of the pre-synaptic spiking event and the post-synaptic spiking event;
   wherein shape of each first pulse and shape of each second varying pulse are controlled for matching physical switching characteristics of each phase change memory element.

2. The method according to claim 1, wherein a conductance of said phase change memory element depends on a magnitude of current flowing through said phase change memory element, and wherein programming and erasing of the phase change memory element are based on the shape of the first pulse, the shape of the second varying pulse, and relative timing of the first pulse with respect to the second varying pulse.

3. The method according to claim 2, wherein applying said first pulse to said pre-synaptic node of said synapse having said phase change memory element further comprises applying said first pulse to a gate of a transistor, said transistor connected in series between said first end and a ground of said phase change memory element, wherein the first pulse and the second varying pulse are controlled by the transistor for restricting amount of time that current flows through the synapse.

4. The method according to claim 3, wherein:
   said first pulse comprises a constant voltage level with a width from 100 to 150 nanoseconds; and
   said second pulse comprises a plurality of pulses lasting from 2 to 5 nanoseconds of increasing frequency, such that the number of said pulses lasting from 2 to 5 nanoseconds applied to said post-synaptic node of said synapse depends on the amount of a time delay by which said post-synaptic spiking event follows said pre-synaptic spiking event.

5. The method according to claim 4, wherein the resistance of said phase change memory element continuously decreases as the number of said plurality of pulses lasting from 2 to 5 nanoseconds applied to said phase change memory element decreases.

6. The method according to claim 4, wherein said second pulse
   further comprises, after said plurality of pulses lasting from 2 to 5 nanoseconds, a stair-case voltage pulse having decreasing voltage levels reaching zero volts such that said magnitude of current flowing through said phase change memory element depends on the amount of time delay by which said pre-synaptic spiking event follows said post-synaptic spiking event.

7. The method according to claim 6, wherein when said pre-synaptic spiking event follows or precedes said post synaptic spiking event by greater than a maximum window of time, no current flows through said phase change memory element.

8. The method according to claim 1, wherein a conductance of said phase change memory element depends on which of said first and second pulses is first applied, and resistance of the phase change memory element is based on relative timing of the pre-synaptic spiking event and the post-synaptic spiking event.

9. A method for producing spike-dependent plasticity in an artificial neuron comprising:
   generating a pre-synaptic spiking event in a first neuron;
   wherein the first neuron comprises an integrate and fire circuit for integrating inputs received by the neuron;
   generating a post-synaptic spiking event in a second neuron;
   wherein the second neuron comprises an integrate and fire circuit for integrating inputs received by the neuron;
   after said pre-synaptic spiking event, applying a first pulse to a gate of a transistor, said transistor connected in series between a first end and a ground of a phase change memory element in a synapse; and after said post-synaptic spiking event, applying a second varying pulse to a post-synaptic node of said synapse;
   wherein current through said synapse is a function of a state of said second varying pulse at the time of said first pulse, wherein conductance of said phase change memory element depends on said current through said synapse and relative timing of the pre-synaptic spiking event and the post-synaptic spiking event, and wherein shape of each first pulse and shape of each second varying pulse are controlled by the transistor for matching physical switching characteristics of each phase change memory element.

10. The method according to claim 9, wherein:

said first pulse comprises a constant voltage level with a width from 100 to 150 nanoseconds; and said second varying pulse comprises a plurality of pulses lasting from 2 to 5 nanoseconds of increasing frequency, such that the number of said pulses lasting from 2 to 5 nanoseconds applied to said post-synaptic node of said synapse depends on the amount of time delay by which said post-synaptic spiking event follows said presynaptic spiking event.

11. The method according to claim 10, wherein said phase change memory element resistance continuously decreases as the number of said pulses lasting from 2 to 5 nanoseconds applied to said phase change memory element, and wherein programming and erasing of the phase change memory element are based on the shape of the first pulse, the shape of the second varying pulse, and relative timing of the first pulse with respect to the second varying pulse.

12. The method according to claim 11, wherein a conductance of said phase change memory element depends on which one of said first and second pulses is first applied, wherein the first pulse and the second varying pulse are controlled by the transistor for restricting amount of time that current flows through the synapse.

13. The method according to claim 12, wherein said second pulse further comprises, after said plurality of pulses lasting from 2 to 5 nanoseconds, a stair-case voltage pulse having decreasing voltage levels reaching zero volts such that a magnitude of current flowing through said phase change memory element depends on the amount of time delay by which said pre-synaptic spiking event follows said post-synaptic spiking event.

14. The method according to claim 13, wherein when said pre-synaptic spiking event follows or precedes said post synaptic spiking event by greater than a maximum window of time, no current flows through said phase change memory element.

15. The method according to claim 9 wherein said second pulse further comprises a plurality of pulses at a fixed frequency followed by a constant voltage level, wherein a magnitude of current flowing through said synapse is a function of the state of said second varying pulse at the time of said first pulse, and wherein a conductance of said phase change memory element depends on said magnitude of current flowing through said phase change memory element.

16. The method according to claim 15, wherein said second varying pulse drops to a zero voltage level after said constant voltage level.

17. An apparatus for producing spike-dependent plasticity in an artificial neuron comprising:

a phase change memory device connected at a first end to a post-synaptic terminal;

a transistor in series between a first end and a ground of said phase change memory device, a gate of said transistor being connected to a pre-synaptic terminal; and a first neuron and a second neuron, wherein said first neuron and said second neuron generate a plurality of voltage pulses to said pre-synaptic and post-synaptic terminals respectively, said first neuron and said second neuron receiving inputs from a plurality of neurons and generating pre-synaptic and post-synaptic internal spiking events respectively when a total integrated input to each neuron exceeds predetermined first and second thresholds;

wherein the first neuron comprises an integrate and fire circuit for integrating inputs received by the neuron; and wherein the second neuron comprises an integrate and fire circuit for integrating inputs received by the neuron;

wherein in response to said pre-synaptic spiking event, said first neuron generates a first pulse at said pre-synaptic terminal that occurs a predetermined period of time after said pre-synaptic spiking event;

wherein in response to said post-synaptic spiking event, said second neuron generates a second pulse at said post-synaptic terminal that comprises a plurality of pulses of increasing frequency, such that current through said phase change memory device is a function of the state of said second pulse at the time of said first pulse and relative timing of the pre-synaptic spiking event and the post-synaptic spiking event, and wherein shape of each first pulse and shape of each second pulse are controlled by the transistor for matching physical switching characteristics of each phase change memory device.

18. The apparatus according to claim 17, wherein a conductance of said phase change memory device depends on a magnitude of current flowing through said phase change memory device, and wherein programming and erasing of the phase change memory device are based on the shape of the first pulse, the shape of the second pulse, and relative timing of the first pulse with respect to the second pulse.

19. The apparatus according to claim 18, wherein the number of said second pulses applied to said post-synaptic terminal depends on a time delay by which said post-synaptic spiking event follows said pre-synaptic spiking event.

20. The apparatus according to claim 19, wherein said phase change memory device resistance depends on a number of pulses applied to said phase change memory device.

21. The apparatus according to claim 17, wherein:

said first pulse comprises a constant voltage level with a width from 100 to 150 nanoseconds; and said transistor is a metal oxide semiconductor (MOS) transistor.

22. An apparatus for producing spike-dependent plasticity in an artificial neuron comprising:

a synapse having post-synaptic and pre-synaptic terminals, and a phase change memory device, said phase change memory device connected at a first end to said postsynaptic terminal;

a transistor connected to a second end of said phase change memory device, a gate of said transistor being connected to said pre-synaptic terminal;

a first neuron connected to said pre-synaptic terminal generating a first pulse in response to a pre-synaptic spiking event;

wherein the first neuron comprises an integrate and fire circuit for integrating inputs received by the neuron; and a second neuron connected to said post-synaptic terminal generating a second pulse in response to a post-synaptic spiking event;

wherein the second neuron comprises an integrate and fire circuit for integrating inputs received by the neuron;

wherein a conductance of said phase change memory device depends on which one of said pre-synaptic or post-synaptic spiking events occur first and relative timing of the pre-synaptic spiking event and the post-synaptic spiking event; and wherein shape of each first pulse and shape of each second pulse are controlled by the transistor for matching physical switching characteristics of each phase change memory device.

23. The apparatus according to claim 22, wherein said phase change memory device is a mushroom cell phase change memory device.

24. The apparatus according to claim 22, wherein said phase change memory device is a pore cell phase change memory device.

25. A computer program product for producing spike-dependent plasticity in an artificial neuron, said computer program product comprising:

a non-transitory computer usable medium having computer usable program code embodied therewith, said computer usable program code comprising:

computer usable program code configured to:

generate a pre-synaptic spiking event in a first neuron when a total integrated input to said first neuron exceeds a first predetermined threshold;

wherein the first neuron comprises an integrate and fire circuit for integrating inputs received by the neuron;

generate a post-synaptic spiking event in a second neuron when a total integrated input to said second neuron exceeds a second predetermined threshold;

wherein the second neuron comprises an integrate and fire circuit for integrating inputs received by the neuron;

after said pre-synaptic spiking event, apply a first pulse to a pre-synaptic node of a synapse having a phase change memory element; and after said post-synaptic spiking event, apply a second varying pulse to a post-synaptic node of said synapse;

wherein current through said synapse is a function of the state of said second varying pulse at the time of said first pulse and relative timing of the pre-synaptic spiking event and the post-synaptic spiking event; and wherein shape of each first pulse and shape of each second varying pulse are controlled for matching physical switching characteristics of each phase change memory element.

* * * * *